US006833997B1

(12) United States Patent
Jones, III et al.

(10) Patent No.: US 6,833,997 B1
(45) Date of Patent: Dec. 21, 2004

(54) COMBINATION TERMINAL/LEADFRAME FOR HEAT SINKING AND ELECTRICAL CONTACTS

(75) Inventors: James L. Jones, III, White Lake, MI (US); Truong Nguyen, Canton, MI (US); Martin Eugene Beckman, Canton, MI (US)

(73) Assignee: Yazaki North America, Inc., Canton, MI (US)

( * ) Notice: Subject to any disclaimer, the term of this patent is extended or adjusted under 35 U.S.C. 154(b) by 13 days.

(21) Appl. No.: 10/445,508

(22) Filed: May 27, 2003

(51) Int. Cl.[7] .............................. H05K 7/02; H05K 7/06; H05K 7/08; H05K 7/10
(52) U.S. Cl. ........................................ 361/760; 361/761
(58) Field of Search ................................ 361/760–761, 361/801–802, 816–818, 752–753; 439/76.2, 79, 485–487

(56) References Cited

U.S. PATENT DOCUMENTS 6,242,800 B1    6/2001  Munos et al.
6,270,360 B1 *  8/2001  Yanase ....................... 439/76.2
6,396,133 B1    5/2002  James
6,400,569 B1    6/2002  Auer
6,643,143 B1 * 11/2003  Stewart et al. .............. 361/828

FOREIGN PATENT DOCUMENTS

JP          06-244522        9/1994

* cited by examiner

*Primary Examiner*—David Zarneke
*Assistant Examiner*—Tuan Dinh
(74) *Attorney, Agent, or Firm*—Young & Basile, P.C.

(57) ABSTRACT

A circuitboard assembly in which power carrying circuitboard traces between MOSFETs or the like and edge terminals are replaced with metal leadframe structures which also serve to perform a heat dissipation function. Each of the leadframes comprises a first planar portion which is bonded by a thermally conductive epoxy to the top surface of a MOSFET and a second elevated planar portion which extends parallel to but above the circuitboard surface into contact with an edge-mounted terminal header. The leadframes may be provided with support legs as well as additional heat dissipating fins.

9 Claims, 5 Drawing Sheets

COMBINATION TERMINAL/LEADFRAME FOR HEAT SINKING AND ELECTRICAL CONTACTS

FIELD OF THE INVENTION

This invention relates to circuitboard assemblies and more particularly to the use of leadframes to replace power transfer traces on circuitboards as well as to provide a heat dissipation function.

BACKGROUND OF THE INVENTION

It is common to mount power transistors such as MOS-FETs on circuitboards having traces on one or more sides. To dissipate thermal energy from the MOSFETs, it is common to place a finned aluminum structure over the top surface of a number of MOSFETs in bonded relationship therewith to act as a common heat sink.

There are a number of disadvantages associated with the above-described structure. For one, the heat dissipating finned structure adds cost and weight to the circuitboard assembly. For another, there is often a problem with crowding due to the large number and complexity of the traces on the circuitboard.

SUMMARY OF THE INVENTION

A primary objective of the present invention is to solve the problems of the prior art structures described immediately above; i.e., to provide a structure which eliminates the need for the finned aluminum heat sink and alleviates the problems associated with trace crowding on circuitboards bearing one or more power transistors and/or equivalent devices, along with other components such as integrated circuits, capacitors, resistors and inductors.

In general, the present invention comprises the combination of a circuitboard having at least one generally planar component mounting surface and conductive traces printed thereon and a terminal structure such as a "header" mounted on the board adjacent one edge for making appropriate and practical interconnections between the traces and devices on the circuitboard and the outside world. In accordance with the invention, one or more semi-conductor power devices such as MOSFETs having planar top surfaces are mounted on the board with some electrodes connected to traces in the conventional fashion but with one or more of the high-current power electrodes connected to the terminal structure by way of a conductive metal strip, commonly known as a "leadframe," most of which is elevated above the mounting surface of the circuitboard. The leadframe has a planar portion bonded to the top surface of at least one power device in thermal transfer relationship therewith to serve two important functions, i.e., to provide a conductive power connection between the power device and the header terminal and to dissipate heat from the power device during normal operation thereof.

In accordance with the preferred embodiment of the invention hereinafter described, the leadframe conductor further comprises an integral support leg which depends from an intermediate portion of the leadframe conductor into supporting engagement with the board and is typically brazed or soldered to the board in the construction or assembly process. In addition, the leadframe is formed with a plurality of upturned individual fins to add surface area which assists in heat dissipation function.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and whwerein.

DETAILED DESCRIPTION OF THE ILLUSTRATIVE EMBODIMENT

Figure 1:
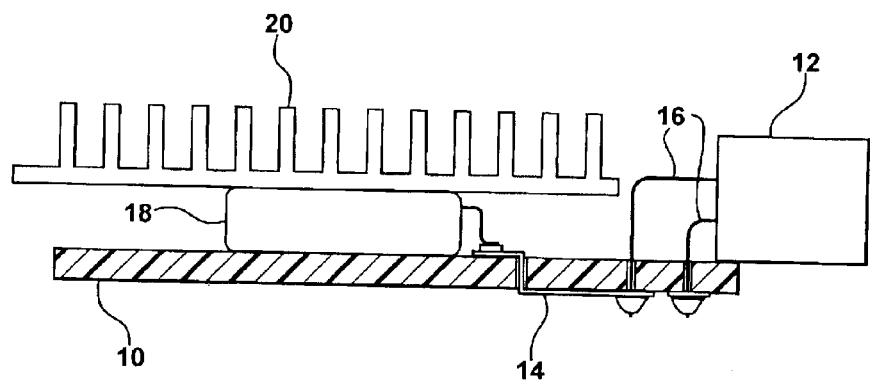
FIG. 1 is a representation of the prior art generally described above.

Referring to the drawings, FIG. 1 shows the prior art structure to comprise a conventional circuitboard 10 made of non-conductive dimensionally stable material and having opposite parallel plane surfaces to receive and mount circuit components including semi-conductor switch devices, resistors, capacitors and so forth. A conventional terminal header 12 is mounted on or adjacent an edge of the circuitboard 10 and interconnected with circuitboard traces 14 by way of stiff L-shaped metal conductors 16 in conventional fashion. A MOSFET 18 is mounted on the board 10 in conventional fashion and interconnected with traces 14 to transfer power to and from devices which are remote from the circuitboard 10 by way of the conductors 16 and terminal contacts in the header box 12. A finned aluminum heat sink 20 is bonded to the top surface of the MOSFET 18 and, in the typical installation, to a number of other similar MOSFETs which are mounted on the board 10 to provide a heat dissipation function.

Figure 4:
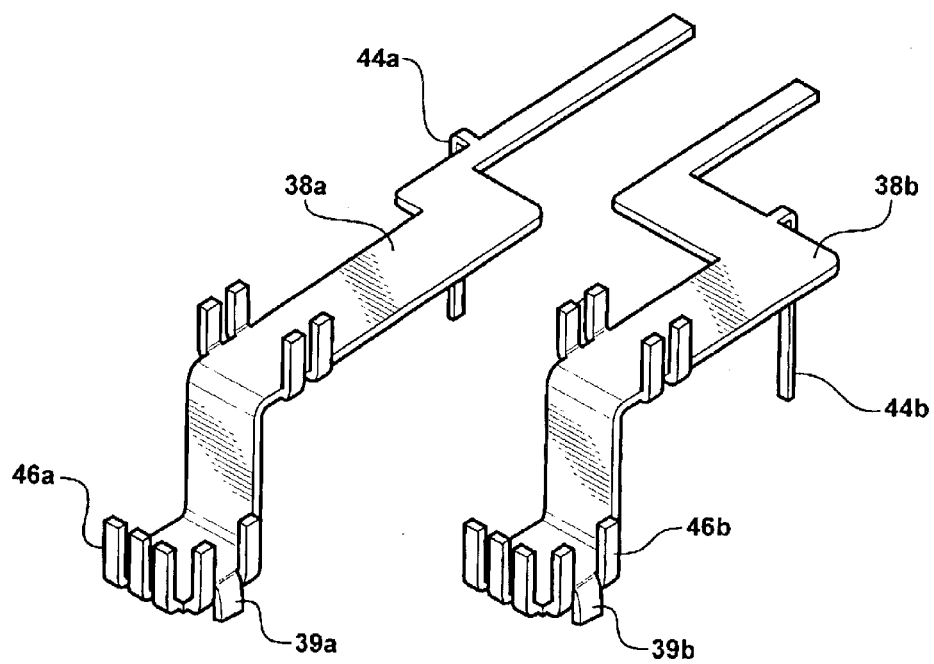
FIG. 4 is a perspective view of the leadframe components in the circuitboard assembly of FIG. 2.
Figure 2:
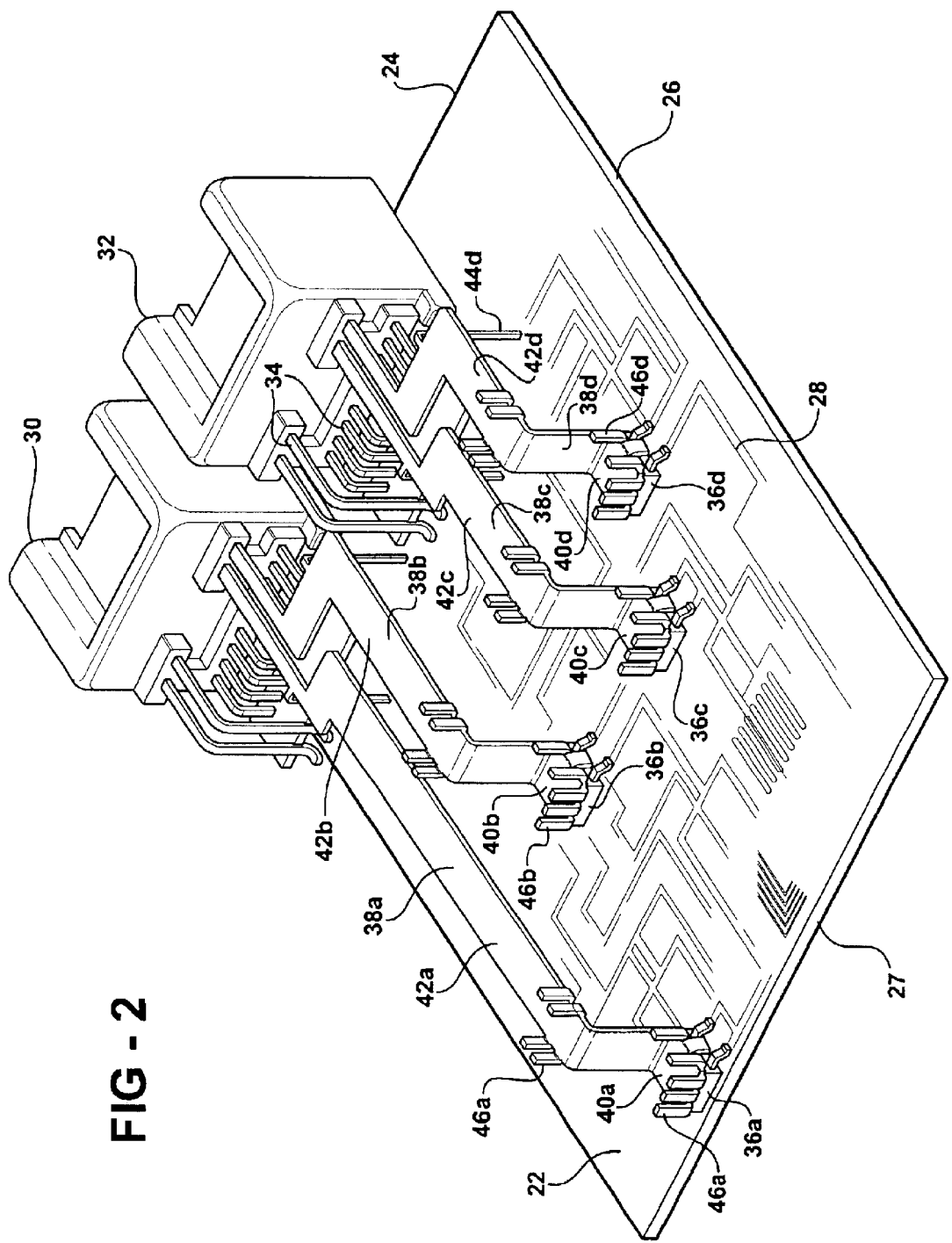
FIG. 2 is a perspective drawing of a circuitboard assembly constructed in accordance with the present invention.
Figure 3:
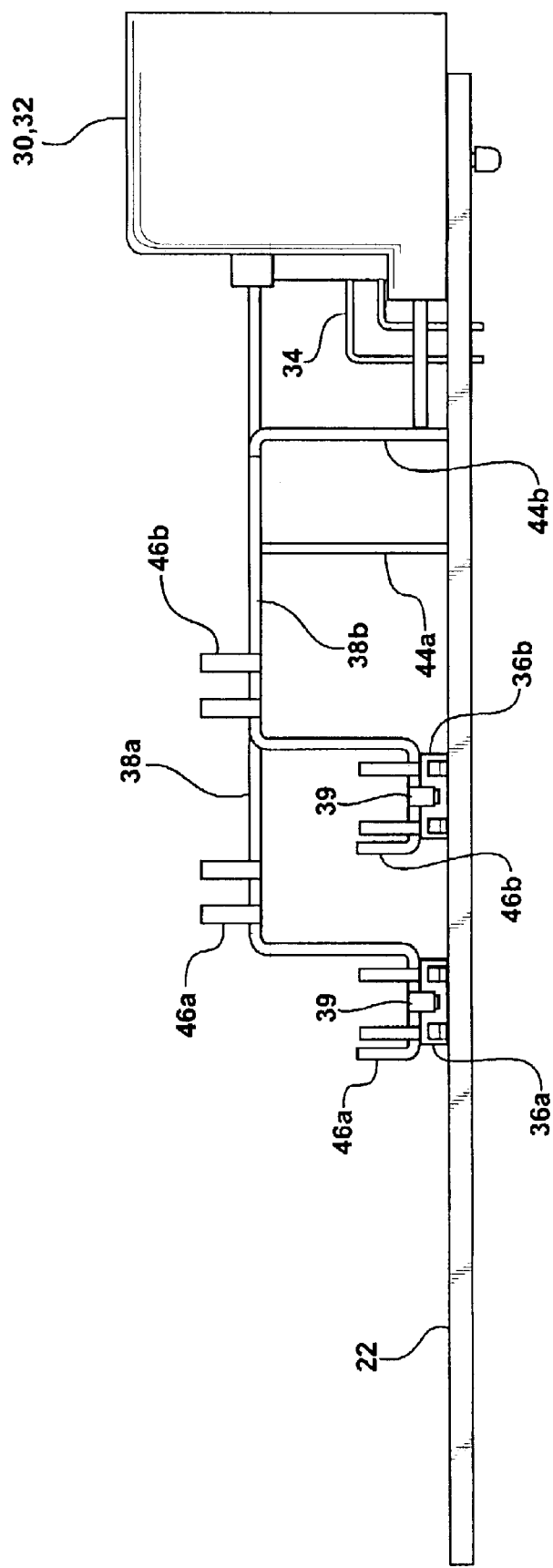
FIG. 3 is a side view of the circuitboard assembly of FIG. 2.

Looking now to FIGS. 2–4, the present invention is shown embodied in an assembly comprising a printed circuitboard (PCB) 22 having edges 24, 26 and 27 and opposite planar mounting surfaces on which traces 28 are printed in the conventional fashion. Terminal headers 30 and 32 of conventional construction are mounted on or near the edge 24 so as to provide an interface between components on the board 22 and other circuit elements in the outside world. Stiff L-shaped metal conductors 34 are connected between the board traces 28 and terminals (not shown) inside of the headers 30 and 32 in conventional fashion. It will be understood that the board 22 may have additional headers mounted on or near other edges.

A plurality of MOSFETs 36a, 36b, 36c and 36d are solder-mounted on the board and electrically connected in part to traces 28. However, the transfer of power from the outside world through the headers 30 and 32 to the MOSFETs 36 is provided by way of metal leadframe conductors 38a, 38b, 38c and 38d, each having a first end which is mechanically and electrically plugged into a header 30, 32 and a second distal end which is bonded to the top plane surface of one of the MOSFETs 36 in heat transfer relationship therewith. In addition, the second end is electrically connected to a power input electrode of the associated MOSFET. The leadframes are made of shape-retaining metal such as a copper alloy with tin plating. Other conductive metals and platings may also be used. The leadframe may be formed by stamping and bending operations as will be apparent to those skilled in the art of sheet metal terminal manufacture.

As stated above, the distal ends of the leadframe conductors 38 are electrically connected at 39 to a power terminal such as the source or drain of the associated MOSFET 36 so as to carry power from the header 30 or 32 to the MOSFET. Alternatively, the connection may be made for the purpose of carrying power from the MOSFET to the outside world through the header. The electrodes of the FETs which are not soldered to a leadframe are soldered to traces 28 on the PCB 22. The bonded portion 40a, 40b, 40c and 40d of each leadframe 38a, 38b, 38c and 38d, respectively, is planar so as to conform to and be easily adhered to the planar top surface of the associated MOSFET 36. Thereafter, each individual leadframe 38 is bent upwardly toward a long planar section 42 which, after assembly, is parallel to but spaced above the mounting surface of the PCB 22 to promote air flow and dissipation of heat from the MOSFET 36 to which the individual leadframe is bonded by means of a thermally conductive epoxy.

A support leg 44 is preferably provided on each of the leadframes 38. This is an integral appendage which is bent downwardly toward the circuitboard 22 and secured such as by brazing or soldering to the circuitboard to provide not only mechanical support for the leadframe but also to perform a locator function.

Finally, each of the leadframes is provided with a plurality of upstanding heat dissipating fins 46, a number of which are integral with and associated with the bonded planar portion 40 and a number of which are associated with the elevated portion 42 as shown.

Figure 5:
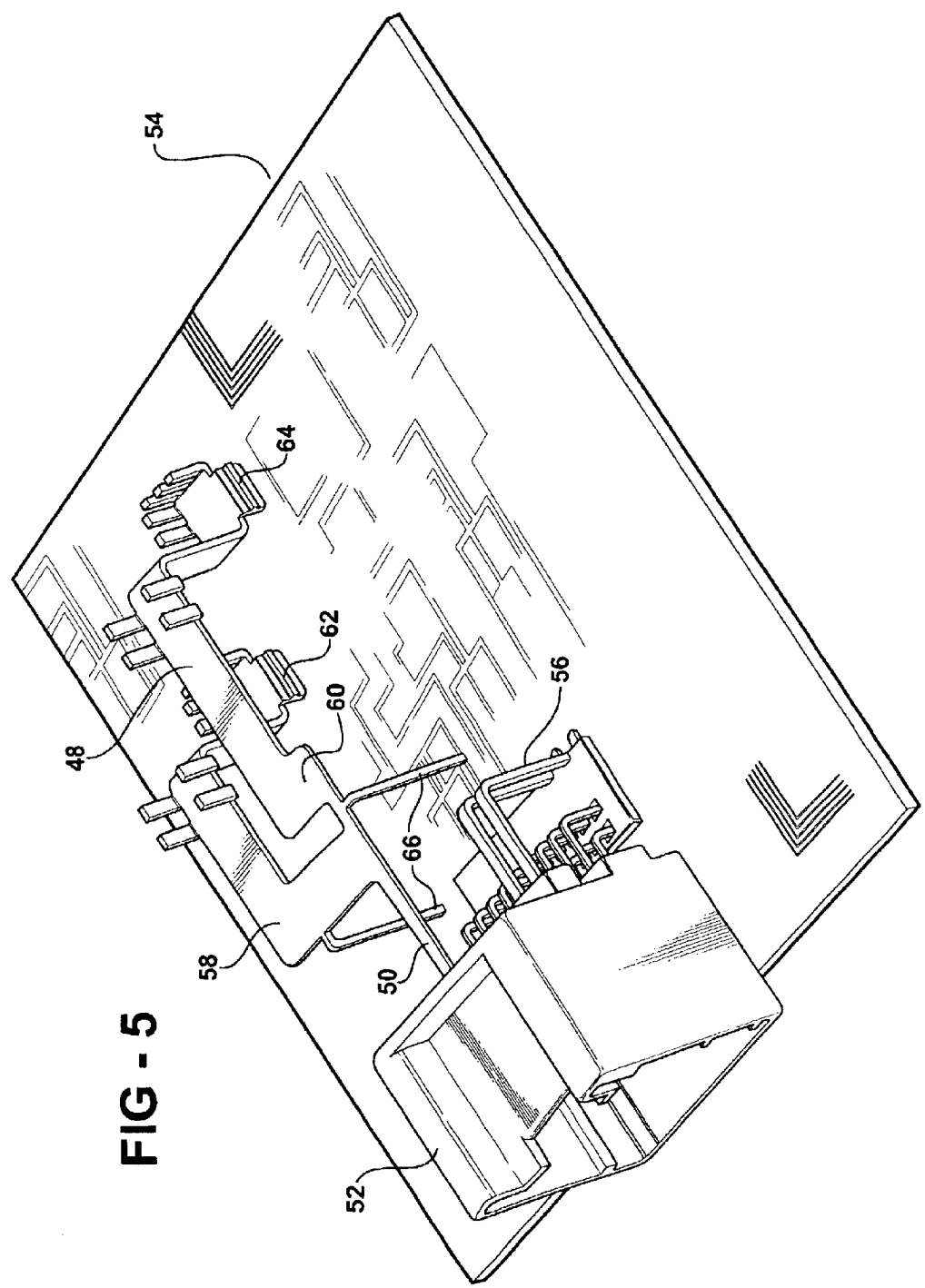
FIG. 5 is another perspective view of another embodiment of the invention.

Referring now to FIG. 5, an alternative structure is illustrated in which a single leadframe 48 serves two MOSFETs as far as power delivery and heat dissipation is concerned. Leadframe 48 is shown with a first narrow end 50 plugged into header 52 on PCB 54. Although not shown in FIG. 5, the PCB has traces printed thereon, such traces being connected to terminals in header 52 by conductors 56 in conventional fashion.

Leadframe 48, although having a common plug portion 50 for connection to header 52, is divided into two essentially parallel elevated legs 58 and 60 which are parallel to and spaced above the PCB 54 in the manner described above with reference to FIGS. 2–4. The legs 58 and 60 are bonded to respective PCB-mounted MOSFETs for thermal transfer and are electrically soldered to MOSFET electrodes for power delivery purposes. Leadframe 48 is finned in the manner of leadframes 38 in FIG. 2. It will be noted in FIG. 5 that each leadframe leg 58, 60 has a tab 62, 64 which depends from the bonded portion which tab may be soldered to PCB 54 for the purpose of relieving strain on the bond between the leadframe and the MOSFETs. Legs 66 provide additional mechanical support as well as a locator function.

Figure 6:
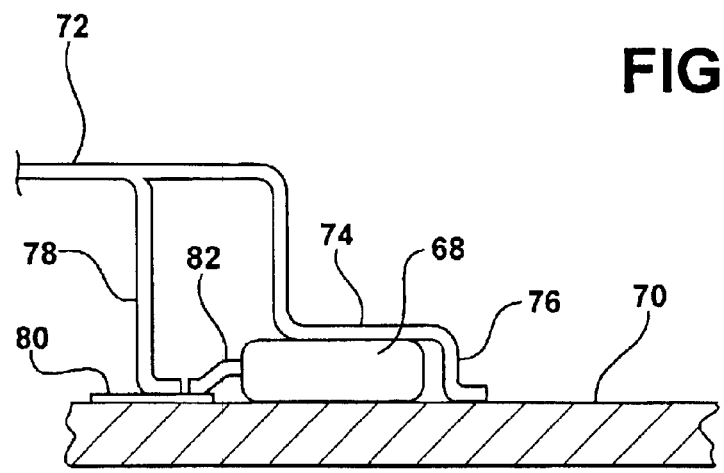
FIG. 6 is a detail of one way of connecting the leadframe to an FET electrode.

FIG. 6 shows one way to connect a leadframe 72 to a MOSFET 68 mounted on PCB 70. Leadframe 72 has a portion 74 bonded to the top surface of MOSFET 68 and a tab 76 which is soldered to the PCB for mechanical stability. Another leg 78 depends from the upper portion of the leadframe and is soldered to a trace 80 on PCB 70. The power electrode 82 is also soldered to the trace such that leadframe 72 delivers power to the MOSFET 68.

Figure 7:
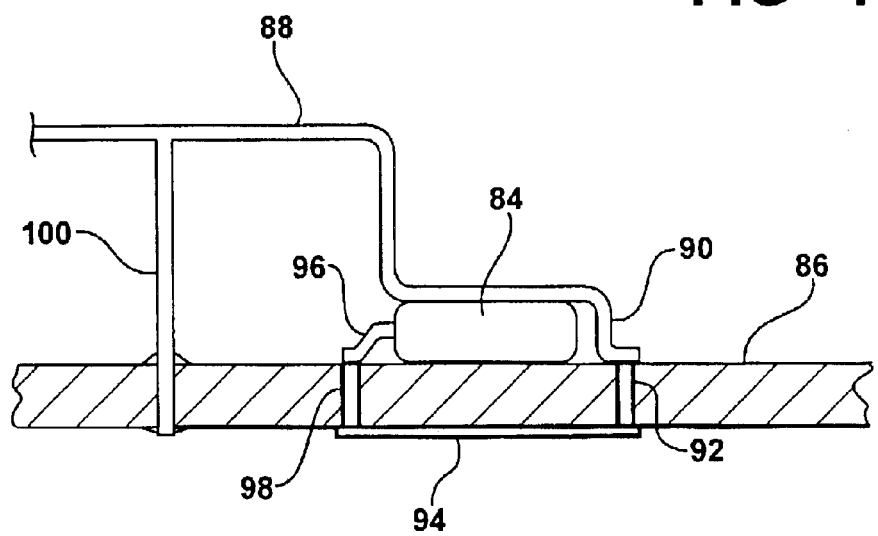
FIG. 7 is a detail of another way of connecting the leadframe to an FET electrode.

FIG. 7 shows another way to connect a leadframe to a MOSFET 84 mounted on PCB 86. In this case, the leadframe 88 is again bonded to the top surface of MOSFET 84 and has a tab 90 which is soldered to a via 92 connecting the leadframe tab to a trace 94 on the bottom of PCB 86. Trace 94 is connected electrically to power electrode 96 by way of another via 98. Leadframe 88 is stabilized by a support leg 100 soldered to PCB 86.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A circuitboard assembly comprising:
   a non-conductive circuitboard having edges and at least one generally planar component mounting surface with conductive traces printed thereon;
   a terminal structure mounted on the board adjacent an edge for receiving terminal ends of electrical conductors and connecting them to traces on the board;
   at least one semi-conductor power switch device having a top surface and being mounted on the board and electrically connected to one or more of said traces; and
   a shape-retaining conductive metal leadframe having first and second opposite ends, the first end being electrically connected to an electrode of said switch device, the second end being connected into and supported by said terminal structure, a portion of the leadframe contactingly overlaying the top surface of the switch device in thermal transfer relationship therewith, essentially the entirety of said leadframe between the switch device and the terminal structure being spaced from the mounting surface of the board so as to dissipate heat from said switch device during operation thereof.

2. A circuitboard assembly as defined in claim 1 wherein the portion of the leadframe between the switch device and the terminal structure is coplanar and in a plane which is above the top of the switch device.

3. A circuitboard assembly as defined in claim 1 further comprising an integral support leg depending from said portion of the leadframe toward the board and being secured to the board to provide mechanical support.

4. A circuitboard assembly as defined in claim 1 further comprising a plurality of fins integral with said leadframe for assisting in said heat dissipation function.

5. A circuitboard assembly as defined in claim 1 wherein the leadframe is electrically connected to a second power device on the circuitboard to supply power thereto.

6. A circuitboard assembly comprising:

- a non-conductive circuitboard having edges and at least one generally planar component mounting surface with conductive traces printed thereon;
- a header for electrical terminations mounted on the board adjacent an edge and being electrically connected by discrete raised conductors to traces on the board;
- a plurality of field effect power transistors having top surfaces and being mounted on the board and electrically connected to one or more of said traces for switching control purposes; and
- a plurality of conductive metal leadframes having first and second opposite ends, each such leadframe being electrically connected to conduct power between a field effect transistor and a terminal in said header, each such leadframe having a planar portion contactingly overlaying the top surface of a field effect transistor in thermal transfer relationship therewith, essentially the entirety of the leadframe between the top surface of the field effect transistor to which it is attached and the header structure being spaced above the mounting surface of the board for heat dissipation purposes.

7. A circuitboard assembly as defined in claim 6 further comprising a support leg integral with said leadframe and depending therefrom into fixed contact with said circuitboard.

8. A circuitboard assembly as defined in claim 6 wherein said leadframe further comprises a plurality of discreet upwardly oriented fins to supplement the heat dissipation function of said leadframe.

9. A circuitboard assembly as defined in claim 6 wherein a single leadframe is thermally and electrically connected to more than one power transistor.

* * * * *